United States Patent

Hoshi et al.

[11] Patent Number: 5,325,374
[45] Date of Patent: Jun. 28, 1994

[54] PREDICTIVE DECODING DEVICE FOR CORRECTING CODE ERRORS

[75] Inventors: Nobuhiro Hoshi; Yoshiki Ishii; Kenichi Nagasawa, all of Kanagawa, Japan

[73] Assignee: Canon Kabushiki Kaisha, Tokyo, Japan

[21] Appl. No.: 148,523

[22] Filed: Nov. 4, 1993

Related U.S. Application Data

[63] Continuation of Ser. No. 531,315, May 31, 1990.

[30] Foreign Application Priority Data

| | | |
|---|---|---|
| Jun. 7, 1989 [JP] | Japan | 1-144531 |
| Jun. 22, 1989 [JP] | Japan | 1-159915 |
| Apr. 10, 1990 [JP] | Japan | 2-095556 |

[51] Int. Cl.$^5$ ............................................. G06F 11/10
[52] U.S. Cl. ................................. 371/43; 371/30; 371/31
[58] Field of Search ................. 375/27, 30; 341/106, 341/76, 43; 371/30, 31

[56] References Cited

U.S. PATENT DOCUMENTS

| | | | |
|---|---|---|---|
| 3,772,682 | 11/1973 | Flanagan | 340/347 DD |
| 4,719,642 | 1/1988 | Lucas | 375/30 |
| 4,807,032 | 2/1989 | Strehl | 358/166 |
| 4,965,580 | 10/1990 | Tasaki | 341/200 |
| 4,979,187 | 12/1990 | Aoki et al. | 375/27 |
| 5,043,728 | 8/1991 | Hoshi et al. | 341/106 |
| 5,063,443 | 11/1991 | Okajima et al. | 358/133 |

OTHER PUBLICATIONS

Patent Abstract of Japan, vol. 12, No. 111, Apr. 8, 1988 and Laid-Open No. 62-241436 (Ohashi).
Patent Abstract of Japan, vol. 11, No. 95, Mar. 25, 1987 and Laid-Open No. 61-247139 (Kashida).

Primary Examiner—Robert W. Beausoliel, Jr.
Assistant Examiner—Ly V. Hua
Attorney, Agent, or Firm—Fitzpatrick, Cella, Harper & Scinto

[57] ABSTRACT

A decoding device used in a predictive coding method includes a replacement circuit for replacing a decoded value corresponding to an encoded code having an uncorrectable error with the decoded value of the immediately preceding sample, and decoding of the succeeding sample is performed according to the decoded value output from the replacement circuit.

16 Claims, 9 Drawing Sheets

PREDICTIVE DECODING DEVICE FOR CORRECTING CODE ERRORS

This application is a continuation of application Ser. No. 07/531,315 filed May 31, 1990.

BACKGROUND OF THE INVENTION

1. Field of the Invention

This invention relates to a decoding device for decoding encoded codes subjected to predictive coding, and more particularly, to countermeasures when a code error occurs in a transmission channel.

2. Description of the Related Art

As a method for reducing the number of transmitted bits for one sample when image information is digitally transmitted, a difference (or differential) predictive coding method (termed hereinafter a DPCM) has been known which compresses data utilizing the property that adjacent sample values have large correlation with each other.

Figure 1:
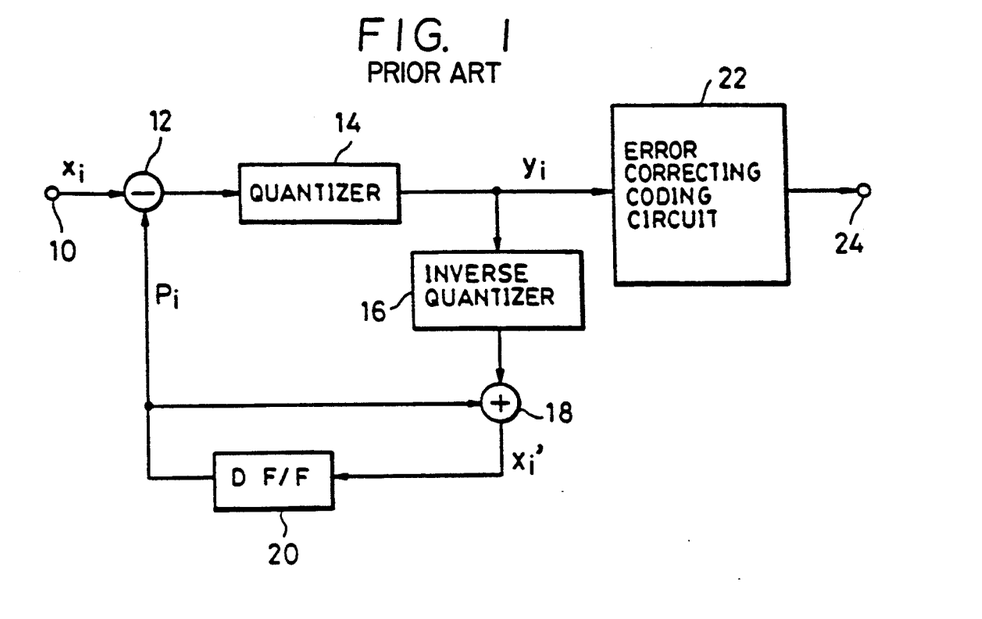
FIG. 1 is a block diagram showing the general configuration of a conventional DPCM encoding device.

FIG. 1 is a block diagram showing the configuration of a most common preceding-value-predictive DPCM encoding device. In FIG. 1, there is shown an input terminal 10 for a sampled value $X_i$. A subtracter 12 subtracts an encode predictive value $P_i$ from the input sampled value $X_i$. A quantizer 14 outputs an encoded $Y_i$. There are also shown an inverse quantizer 16, and an adder 18. A D-flip-flop 20 outputs an encode predictive value. An error correcting coding circuit 22 adds an error correcting code to the encoded code $Y_i$. An output terminal 24 is for a string of transmitted codes with error correcting codes added thereto.

The subtracter 12 subtracts the encode predictive value $P_i$ (consisting of 8 bits), which is a decoded value of the immediately preceding value output from the D-flip-flop 20, from the sampled value $X_i$ (consisting of 8 bits) from the input terminal 10. The quantizer 14 quantizes a difference value output from the subtracter 12, and outputs a DPCM-encoded code $Y_i$ (consisting of 4 bits). The error correcting coding circuit 22 adds a parity for error correction to the encoded code $Y_i$ output from the quantizer 14, and outputs the resultant signal to the output terminal 24. The inverse quantizer 16 inversely quantizes the DPCM-encoded code $Y_i$ (consisting of 4 bits) output from the quantizer 14, and outputs a representative quantized difference value of a difference (consisting of 8 bits). The adder 18 adds the encode predictive value $P_i$ to the output from the inverse quantizer 16, and outputs a local decoded value $X_i'$. The D-flip-flop 20 delays the local decoded value $X_i'$ for an interval of one sample, and supplies it to the subtracter 12 and the adder 18 as the encode predictive value $P_i$.

In general, the generation probability of the difference value between the encode predictive value $P_i$ and the sampled value $X_i$ concentrates in very small values. Accordingly, by having a configuration in which regions having small difference values are finely quantized, and in which regions having large difference values are coarsely quantized, compression of the amount of information becomes possible.

Table 1 shows a correspondence relation among difference values (outputs from the subtracter 12), DPCM-encoded codes $Y_i$ output from the quantizer 14, and representative difference values output from the inverse quantizer 16.

TABLE 1

| Range of difference value | DPCM code | Representative difference value |
|---|---|---|
| −255−−94 | 0 | −140 |
| −93−−70 | 1 | −80 |
| −69−−50 | 2 | −58 |
| −49−−34 | 3 | −40 |
| −33−−22 | 4 | −27 |
| −21−−13 | 5 | −17 |
| −12−−6 | 6 | −8 |
| −5−−2 | 7 | −3 |
| −1-1 | 8 | 0 |
| 2-5 | 9 | 3 |
| 6-11 | 10 | 8 |
| 12-20 | 11 | 15 |
| 21-35 | 12 | 27 |
| 36-53 | 13 | 44 |
| 54-93 | 14 | 70 |
| 94-255 | 15 | 150 |

As shown in Table 1, the quantizer 14 performs non-linear quantization, and as a result, compresses the amount of information to one half.

Figure 2:
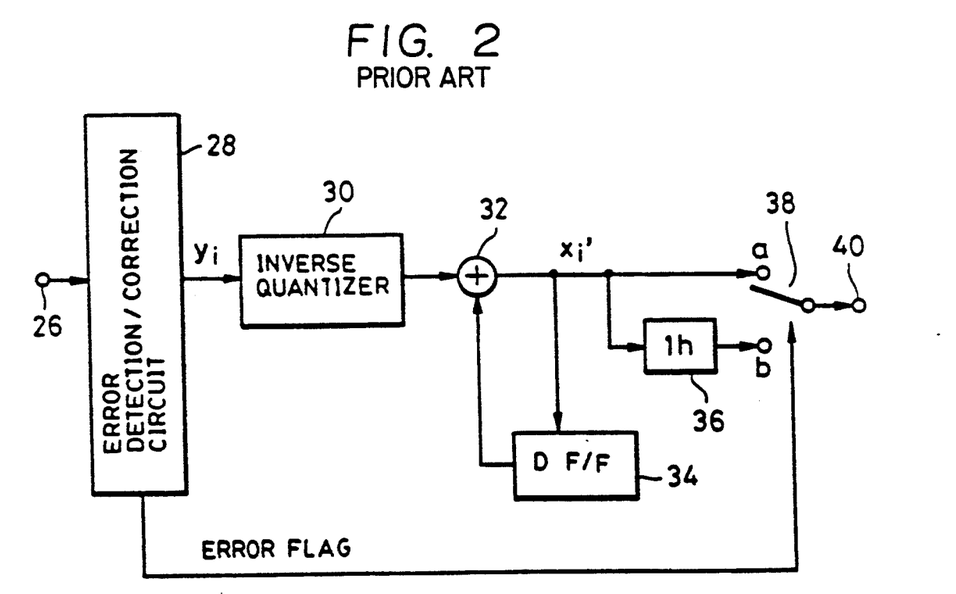
FIG. 2 is a block diagram showing the configuration of a decoding device corresponding to the encoding device shown in FIG. 1.

FIG. 2 shows a block diagram of the configuration of a decoding device corresponding to the encoding device shown in FIG. 1. In FIG. 2, there are shown an input terminal 26 for a transmitted DPCM-encoded code, an error detection/correction circuit 28, an inverse quantizer 30, an adder 32, a D-flip-flop 34, a switch 38, a 1-line delay unit 36, and an output terminal 40 for a decoded value.

In the transmitted code input from the input terminal 26, an error which occurred during data transmission is detected and corrected by the error detection/correction circuit 28. The error detection/correction circuit 28 supplies the inverse quantizer 30 with the DPCM-encoded code $Y_i$, and outputs an error flag (see FIG. 3) for controlling the switch 38 if the error could not be corrected. The inverse quantizer 30 inversely quantizes the DPCM-encoded code $Y_i$, and outputs a representative difference value. The adder 32 adds an output from the D-flip-flop, which is the decoded value of the immediately preceding value, to the output from the inverse quantizer 30. The output from the adder 32 becomes the decoded value $X_i'$. The output from the adder 32 is delayed for an interval of one sample by the D-flip-flop 34, and is returned to the adder 32 as the decoded value (decode predictive value) of the immediately preceding value.

Figure 3:
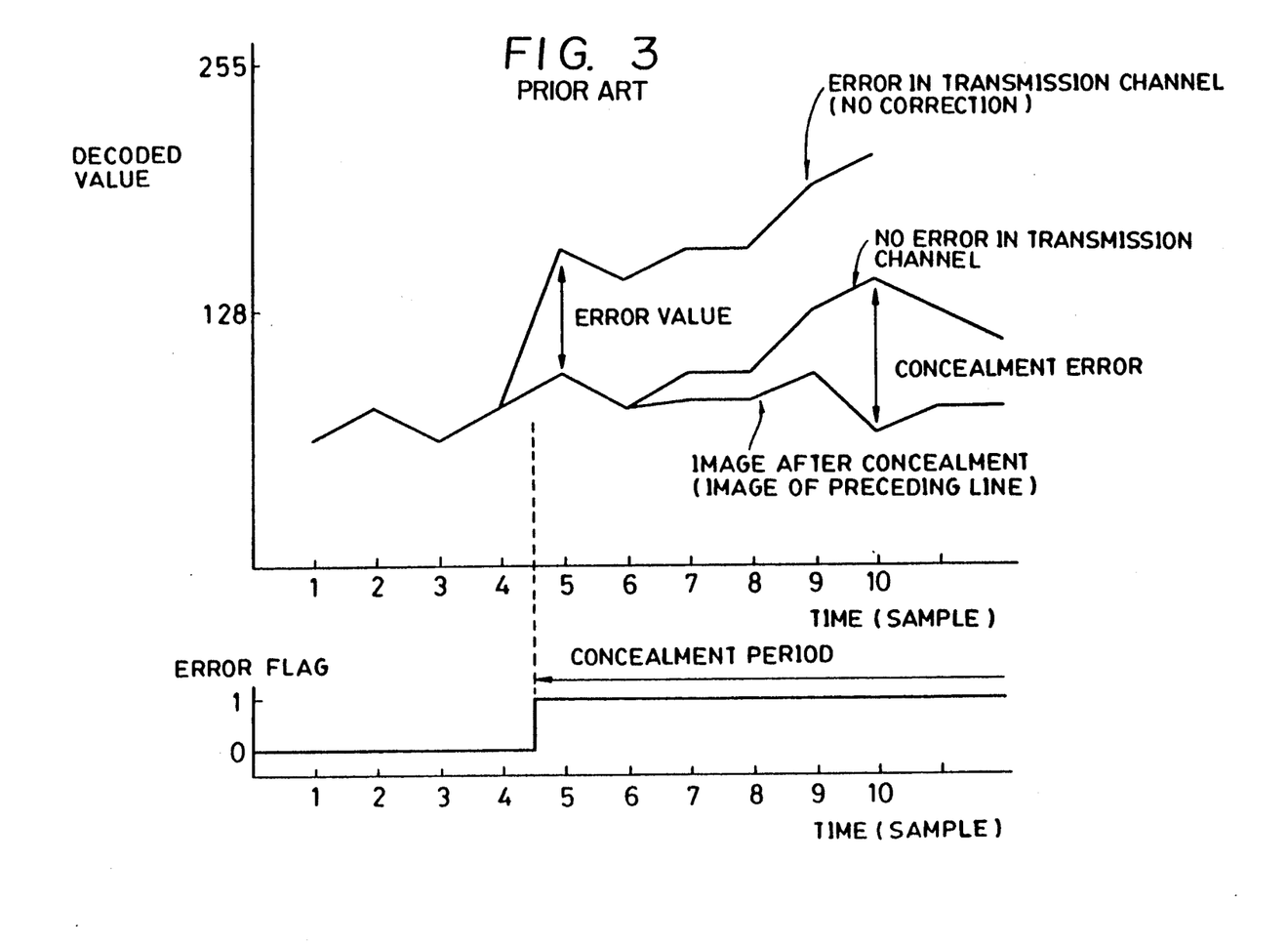
FIG. 3 is a timing chart for explaining the operation of each unit shown in FIG. 2.

The output from the adder 32 is directly supplied to contact "a" of the switch 38, and is also supplied to contact "b" of the switch 38 via the 1-line delay unit 36. In general, in the DPCM, it is known that, when an error once occurs in a transmission channel, the error is propagated to succeeding decoded values $X_{i+1}$-$X_{i+j}$ until the decoded value (reset value) of the DPCM-encoded code obtained by quantizing the sampled value itself is subsequently obtained. Accordingly, when an uncorrectable error is detected in the encoded code $Y_i$ by the error detection/correction circuit 28, an error flag is raised after the detection of the uncorrectable error, as shown in FIG. 3. While the error flag is raised, the switch 38 is switched to the side of contact "b", and the decoded value is replaced, that is, concealed by the sampled value on the immediately preceding line. FIG. 3 shows changes in the decoded values by this concealment at respective sampled points.

In the above-described conventional example, however, since the decoded value is replaced by the sampled value on the immediately preceding line, there is a disadvantage in that a 1-line delay unit is needed, causing an increase in hardware. Furthermore, since all the decoded values after the detection of the uncorrectable encoded code are replaced, there is a disadvantage in that much deterioration in an image occurs if there is no correlation between a sampled value on the current line and a sampled value on the immediately preceding line. In such a case, the difference between the sampled value on the immediately preceding line and the sampled value in the case of no transmission-line error becomes large, as shown in FIG. 3, causing remarkable deterioration in picture quality.

SUMMARY OF THE INVENTION

It is an object of the present invention to solve the problems as described above.

It is another object of the present invention to provide a predictive decoding device which can minimize deterioration in transmitted information even when a code error occurs in a transmission channel.

These objects are accomplished, according to one aspect of the present invention, by a predictive decoding device for decoding an encoded code obtained by quantizing a difference value between a sampled value and an encode predictive value, comprising (a) error detection means for detecting a code error in the encoded code and for outputting an error flag, (b) decoding means for outputting a decoded value in accordance with the encoded code and a decode predictive value, (c) replacement means operating in accordance with the error flag and for functioning so that a portion of decoded values output from the decoding means is replaced with a past decoded value, and (d) predictive means for calculating the decode predictive value using the decoded value replaced with the past decoded value by the replacement means.

According to another aspect, the present invention relates to a predictive decoding device for decoding an encoded code obtained by quantizing a difference value between a sampled value and an encode predictive value by selectively using n (n is an integer equal to 2 or more) kinds of quantization characteristics having a common arrangement of encoded codes relative to the magnitude of the difference value in accordance with the predictive value, where a representative quantized value according to the n kinds of quantization characteristics has a smaller value for a quantization characteristic used for a larger value of the predictive value relative to at least one encoded code, the device comprising (a) error detection means for detecting a code error in the encoded code and for outputting an error flag, (b) decoding means for outputting a decoded value in accordance with the encoded code and the predictive value by selectively using n kinds of inverse quantization characteristics corresponding to the n kinds of quantization characteristics in accordance with the predictive value, (c) replacement means operating in accordance with the error flag and for functioning so that a portion of decoded values output from the decoding means is replaced by a past decoded value, and (d) predictive means for calculating the predictive value using the decoded value replaced with the past decoded value by the replacement means.

These and other objects and features of the present invention will become more apparent from the following detailed description of the preferred embodiments with reference to the accompanying drawings.

DETAILED DESCRIPTION OF THE PREFERRED EMBODIMENTS

The preferred embodiments of the present invention will now be explained with reference to the drawings.

Figure 4:
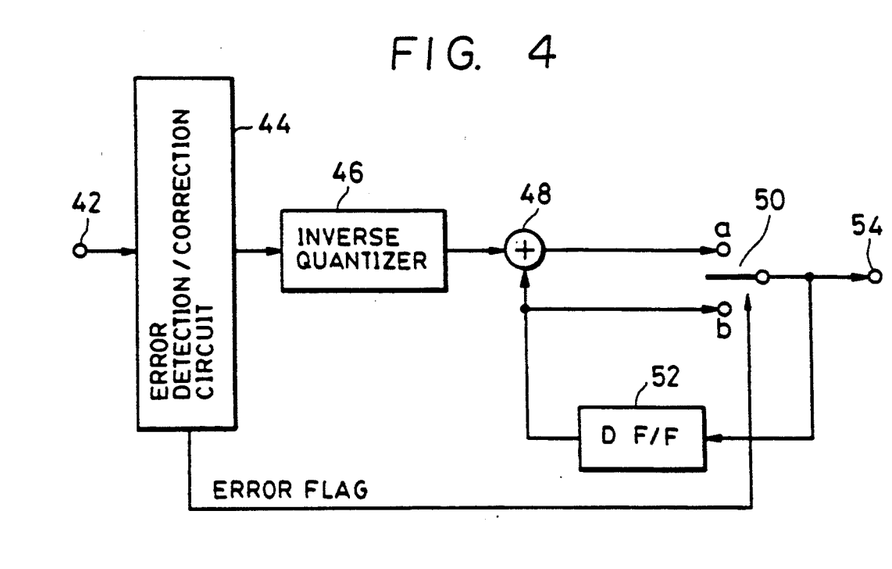
FIG. 4 is a block diagram showing the configuration of a decoding device according to an embodiment of the present invention.

FIG. 4 is a block diagram showing the configuration of a decoding device according to an embodiment of the present invention. In FIG. 4, there are shown an input terminal 42 for transmitted data, an error detection/correction circuit 44, an inverse quantizer 46, and an adder 48. A switch 50 is switched by an error flag indicating the occurrence of an incorrectable error code. A D-flip-flop 52 functions as a delay unit for an interval of one sample. There is also shown an output terminal 54 for a decoded value.

The error detection/correction circuit 44 receives transmitted data from the input terminal 42, detects and corrects a code error during transmission, and supplies the inverse quantizer 46 with a DPCM code. The error detection/correction circuit 44 also raises an error flag controlling the switch 50 for a period of one sample for an uncorrectable code error, as shown in FIG. 5.

The adder 48 adds an output (the immediately preceding decoded value) from the D-flip-flop 52 to an output (a representative difference value) from the inverse quantizer 46. An output from the adder 48 is connected to contact "a" of the switch 50, and an output from the D-flip-flop 52 is connected to contact "b" of the switch 50. A signal selected by the switch 50 is supplied to the output terminal 54 as a decoded value, and is also supplied to the D-flip-flop 52. That is, the switch 50 is usually connected to contact "a" to select the output from the adder 48. However, when an uncorrectable code error occurs, the switch 50 is connected to contact "b" for a period of one sample in accordance with the error flag from the error detection/correction circuit 44 to select the immediately preceding decoded value.

Figure 5:
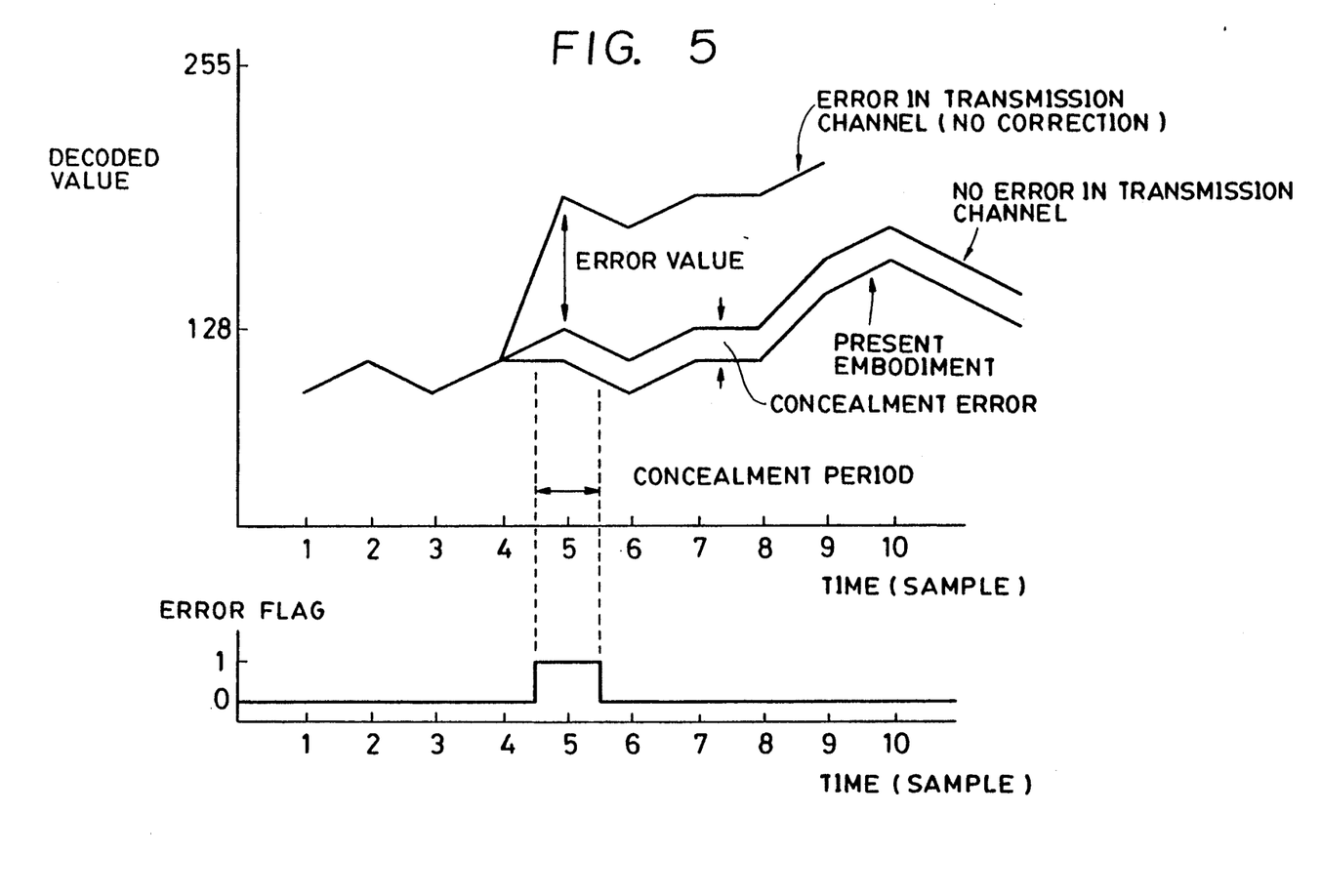
FIG. 5 is a timing chart for explaining the operation of each unit shown in FIG. 4.

FIG. 5 is a timing chart for explaining the operation of the decoding device shown in FIG. 4. An uncorrectable code error has occurred in the encoded code at the moment of the fifth sample, and the decoded value erroneously decoded at that moment is replaced by the decoded value of the preceding sample. In general, since the sampled value of the preceding sample has very high correlation with the current sampled value, a concealment error in the decoded value is very small. Subsequently, decoding is performed by transmitted DPCM codes, the concealment error is confined within a predetermined value, and hence does not increase. In particular, when an uncorrectable transmitted error occurs in a sample having the same sampled value as in the preceding sample, the concealment error is zero.

Figure 6:
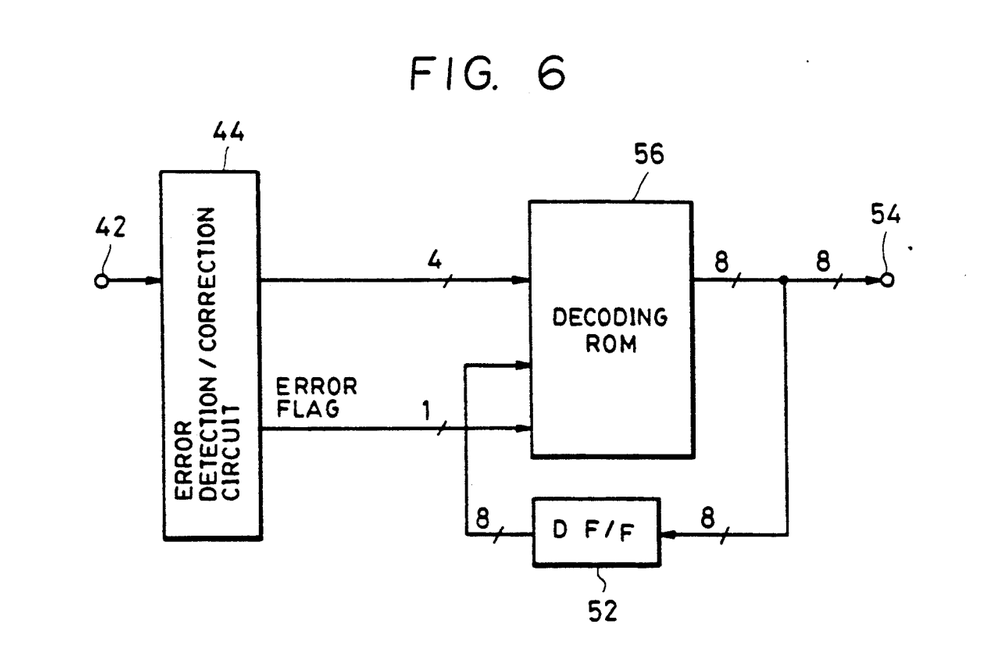
FIG. 6 is a block diagram showing the configuration of a decoding device according to another embodiment of the present invention.

The portion of the inverse quantizer 46, the adder 48 and the switch 50 may be formed by a ROM table. FIG. 6 is a block diagram showing the configuration of the ROM table. A ROM 56, serving as a decoding table, allocates 4 bits 8 bits and 1 bit for the DPCM code input, the decode predictive value input and the error flag input which is output from the error detection/correction circuit 44, respectively an 8-bit output is read from an address determined in accordance with those inputs. In the ROM 56, a data table may be stored so that the decoded value of the preceding value, that is, the same code as the output from the D-flip-flop is output from an address corresponding to a case in which an error flag is raised, and so that a value obtained by adding the decoded value of the preceding value from the D-flip-flop to the representative difference value of a 4-bit DPCM code is output from an address corresponding to a case in which an error flag is not raised.

Although, in the above-described embodiment, an explanation has been provided illustrating the preceding-value-predictive encoding method, the present invention may, of course, be also applied to an interframe predictive encoding method or an interline predictive encoding method.

As can be easily understood from the above explanation, according to the above-described embodiment, since a 1-line delay unit is not used, the circuit configuration becomes simplified and inexpensive. Furthermore, since the decoded value is replaced by the immediately preceding value having the highest correlation when correction is impossible, the concealment error is very small. In addition, since the subsequent decoding is performed by the replaced decoded value, the concealment error does not increase with time.

Figure 7:
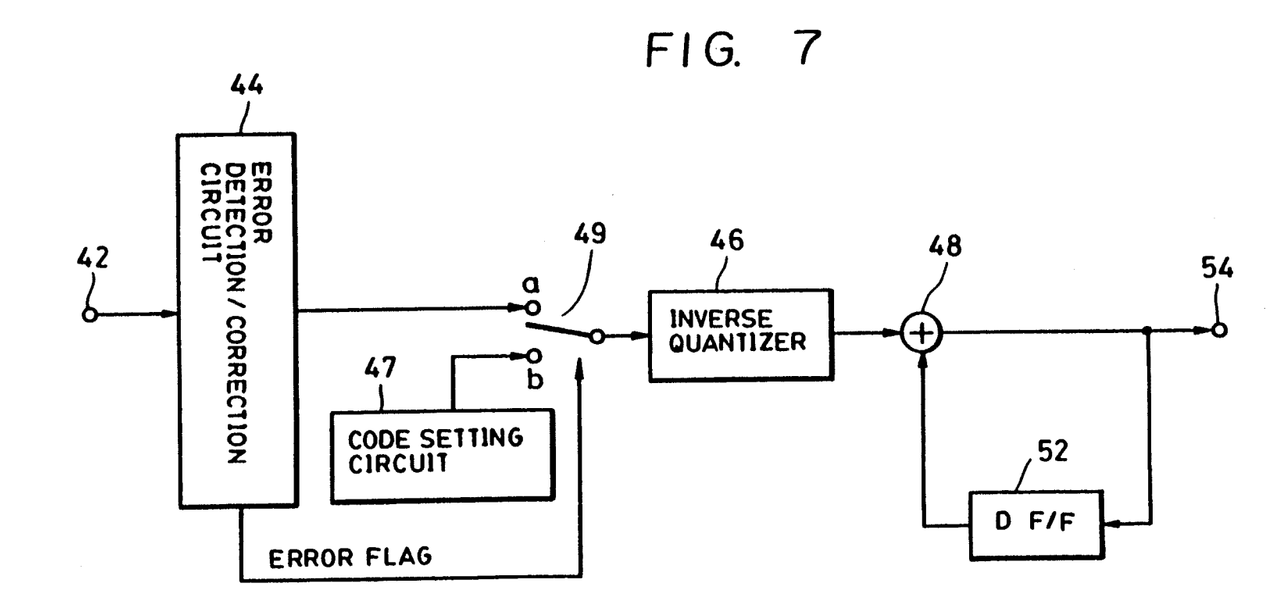
FIG. 7 is a block diagram showing the configuration of a decoding device according to still another embodiment of the present invention.

FIG. 7 is a block digram showing the configuration of a decoding device according to another embodiment of the present invention. In FIG. 7, components identical to those shown in FIG. 4 are indicated by identical numerals. A code setting circuit 47, in which a DPCM code ('8' in the example shown in Table 1) making the representative difference value 0 is set, outputs the code. A switch 49 is usually connected to the side of the output from the error detection/correction circuit 44, and is switched to the side of the code setting circuit 47 in accordance with an error flag from the error detection/correction circuit 44.

The error detection/correction circuit 44 raises an error flag controlling the switch 49 for a period of one sample for an uncorrectable transmitted error, as shown in FIG. 5. Accordingly, when there is no uncorrectable transmitted error, an output from the error detection/correction circuit 44 is supplied to the inverse quantizer 46, and when there is an uncorrectable transmitted error, an output from the code setting circuit 47 is supplied to the inverse quantizer 46.

The adder 48 adds an output (the immediately preceding decoded value) from the D-flip-flop 52 to an output (the representative difference value) from the inverse quantizer 46. An output from the adder 48 is supplied to the output terminal 54 as a decoded value, and is also supplied to the D-flip-flop 52.

When the error detection/correction circuit 44 cannot correct a transmitted error, since the switch 49 is connected to the side of the code setting circuit 47, the inverse quantizer 46 outputs 0. Accordingly, the output from the adder 52 remains the decoded value of the immediately preceding sample. Suppose, for example, that an uncorrectable transmitted error occurs at the moment of the fifth sample, as shown in FIG. 5. The decoded value erroneously decoded at that moment is replaced by the decoded value of the immediately preceding sample by the code setting circuit 47 and the switch 49.

Accordingly, also in the FIG. 7 embodiment, the same effects and functions as those in the FIG. 4 embodiment may be obtained. That is, also in the FIG. 6 embodiment, since 1-line delay unit is not used, the circuit configuration becomes simplified and inexpensive. Furthermore, since the decoded value is replaced by the immediately preceding value having the highest correlation when correction is impossible, the concealment error is very small, and the concealment error does not increase with time.

Next, an explanation will be provided of still another embodiment of the present invention.

Figure 8:
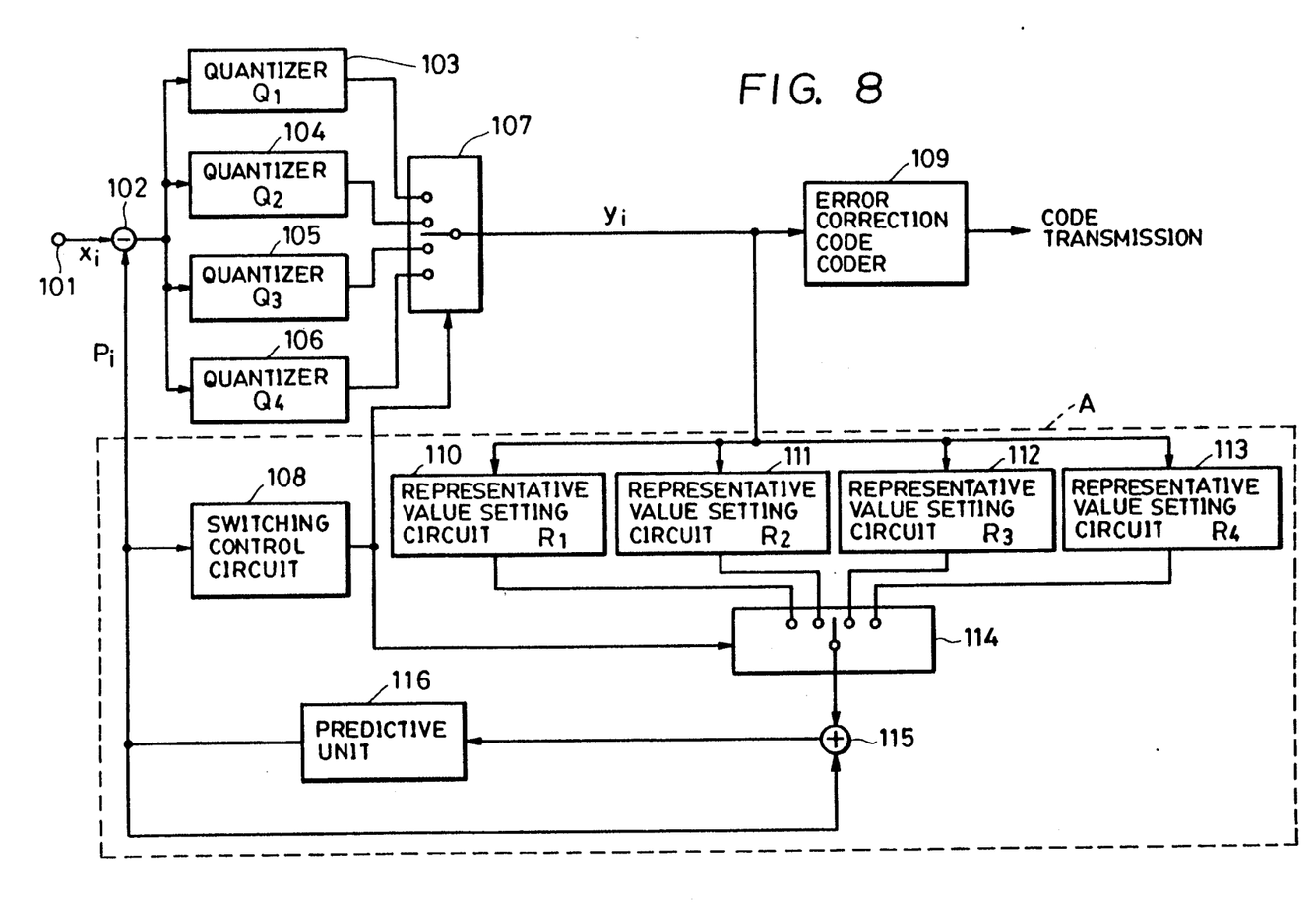
FIG. 8 is a block diagram showing the configuration of an encoding device according to an embodiment of the present invention.

FIG. 8 is a diagram showing the schematic configuration of an encoding device using the DPCM encoding method according to still another embodiment of the present invention.

In FIG. 8, a difference between an input 8-bit digital sampled value $X_i$ and a predictive value $P_i$, which will be described later, is obtained by a subtracter 102, and the difference value is input to quantizers ($Q_1$–$Q_4$) 103–106.

The quantizers ($Q_1$–$Q_4$) 103–106 have different quantization characteristics. Tables 2.1, 2.2, 2.3 and 2.4 show nonlinear quantization tables for the quantizers ($Q_1$–$Q_4$) 103–106, respectively. The 8-bit sampled value is subjected to nonlinear quantization by the four quantizers ($Q_1$–$Q_4$) 103–106, and is converted into 4-bit data. Outputs from the quantizers ($Q_1$–$Q_4$) 103–106 are supplied to a switch 107.

TABLE 2.1

| | $Q_1$ | |
|---|---|---|
| Sampled value | Code | Representative value |
| 207–255 | 7 | 231 |
| 159–206 | 6 | 183 |
| 111–158 | 5 | 135 |
| 70–110 | 4 | 90 |
| 40–69 | 3 | 55 |
| 17–39 | 2 | 27 |
| 6–16 | 1 | 11 |
| 2–5 | 0 | 4 |
| 1 | −1 | 1 |
| 0 | −2 | 0 |
| −1 | −3 | −1 |
| −5−−2 | −4 | −4 |
| −16−−6 | −5 | −11 |
| −17−−39 | −6 | −27 |

TABLE 2.1-continued

| | $Q_1$ | |
|---|---|---|
| Sampled value | Code | Representative value |
| −40− −63 | −7 | −55 |

TABLE 2.2

| | $Q_2$ | |
|---|---|---|
| Sampled value | Code | Representative value |
| 117−191 | 7 | 153 |
| 53−116 | 6 | 87 |
| 31−52 | 5 | 45 |
| 14−30 | 4 | 21 |
| 5−13 | 3 | 9 |
| 2−4 | 2 | 3 |
| 1 | 1 | 1 |
| 0 | 0 | 0 |
| −1 | −1 | −1 |
| −4− −2 | −2 | −3 |
| −5− −13 | −3 | −9 |
| −14− −30 | −4 | −21 |
| −31− −52 | −5 | −45 |
| −53− −116 | −6 | −87 |
| −117− −127 | −7 | −122 |

TABLE 2.3

| | $Q_3$ | |
|---|---|---|
| Sampled value | Code | Representative value |
| 117−127 | 7 | 122 |
| 53−116 | 6 | 87 |
| 31−52 | 5 | 45 |
| 14−30 | 4 | 21 |
| 5−13 | 3 | 9 |
| 2−4 | 2 | 3 |
| 1 | 1 | 1 |
| 0 | 0 | 0 |
| −1 | −1 | −1 |
| −4− −2 | −2 | −3 |
| −5− −13 | −3 | −9 |
| −14− −30 | −4 | −21 |
| −31− −52 | −5 | −45 |
| −53− −116 | −6 | −87 |
| −117− −191 | −7 | −153 |

TABLE 2.4

| | $Q_4$ | |
|---|---|---|
| Sampled value | Code | Representative value |
| 40−63 | 7 | 55 |
| 17−39 | 6 | 27 |
| 6−16 | 5 | 11 |
| 2−5 | 4 | 4 |
| 1 | 3 | 1 |
| 0 | 2 | 0 |
| −1 | 1 | −1 |
| −5− −2 | 0 | −4 |
| −16− −6 | −1 | −11 |
| −39− −17 | −2 | −27 |
| −69− −40 | −3 | −55 |
| −110− −70 | −4 | −90 |
| −158− −111 | −5 | −135 |
| −206− −159 | −6 | −183 |
| −255− −207 | −7 | −231 |

The switching operation of the switch 107 is controlled by a switching control circuit 108, which detects, for example, the two most significant bits in the 8-bit encode predictive value $P_i$ output from a predictive unit 116 (which will be described later) in order to detect to which level range the encode predictive value $P_i$ at that moment is, and controls the switch 107 so as to output one of the output signals from the quantizers ($Q_1$–$Q_4$) 103–106 in accordance with the result of the detection.

That is, if the level of the 8-bit predictive value $P_i$ is divided into four levels (for example, 0–63, 64–127, 128–191, and 192–255), the ranges of levels which the difference value between the encode predictive value $P_i$ and the sampled value $X_i$ obtained by the subtractor 102 can generate become −63 −255, −127 −191, −191 −127, and −255 −63. Accordingly, by providing 8-bit-to-4-bit nonlinear quantization tables in the level range which each difference value can generate, as shown in Tables 2.1–2.4, the range of the nonlinear quantization level becomes narrower than −255 −255 in each table. Hence, it becomes possible to effectively utilize allocation of 4 bits, and to finely perform quantization.

When the level of the 8-bit encode predictive value $P_i$ is divided into 4 levels as described above, it is possible to determine to which of the divided levels the encode predictive value $P_i$ belongs by knowing its significant 2 bits. Hence, the switch 107 is connected to the output from the quantizer corresponding to the determined level of the encode predictive value $P_i$ by the switching control circuit 108, as described above. When, for example, the level of the encode predictive value $P_i$ is determined to be 64–127 by the switching control circuit 108, the switch 107 is connected to the output from the quantizer $Q_2$.

An error correcting code is added to the 4-bit encoded code quantized by the quantizer selected as described above by an error correcting coder 109, and the resultant signal is transmitted to a transmission channel. The above-described encoded code $Y_i$ is also input to representative value setting circuits ($R_1$–$R_4$) 110–113. The representative value setting circuits ($R_1$–$R_4$) 110–113 have inverse characteristics corresponding to the quantizers ($Q_1$–$Q_4$) 103–106. The quantizers $Q_1$, $Q_2$, $Q_3$ and $Q_4$ correspond to the representative value setting circuits $R_1$, $R_2$, $R_3$ and $R_4$, respectively.

The 4-bit encoded code is inversely converted into an 8-bit representative value by each of the representative value setting circuits ($R_1$–$R_4$) 110–113, as shown in each of Tables 2.1–2.4, and the representative value is supplied to a switch 114.

The switching operation of the switch 114 is controlled by the switching control circuit 108 in the same manner as the switch 107, and is connected to the output of the corresponding representative setting circuit in accordance with the above-described correspondence.

The representative value output from the switch 114 is added to the encode predictive value $P_i$ output from a predictive unit 116 in an adder 115, and thus a local decoded value $X_i'$ is obtained. The local decoded value $X_i'$ is input to the predictive unit 116.

In the above-described encoding device having the configuration shown in FIG. 8, the quantization error can be made smaller than in the encoding device shown in FIG. 1 without changing the compression rate. The assignee of the present application has previously proposed the configuration of the device shown in FIG. 8 itself in Japanese Patent Application No. 61-56619 (1986). However, the allocation of codes in each of the above-described quantizers is different from that shown in the above-described Japanese Patent Application No. 61-56619 (1986).

That is, in the quantizers ($Q_1$–$Q_4$) 103–106, the arrangement of encoded codes relative to the amounts of difference values is common to the quantizers. In the examples of Tables 2.1-2.4, the encoded code becomes a code at a higher position in Tables 2.1-2.4 as the difference value increases, and becomes a code at a lower position as the difference value decreases.

Figure 9:
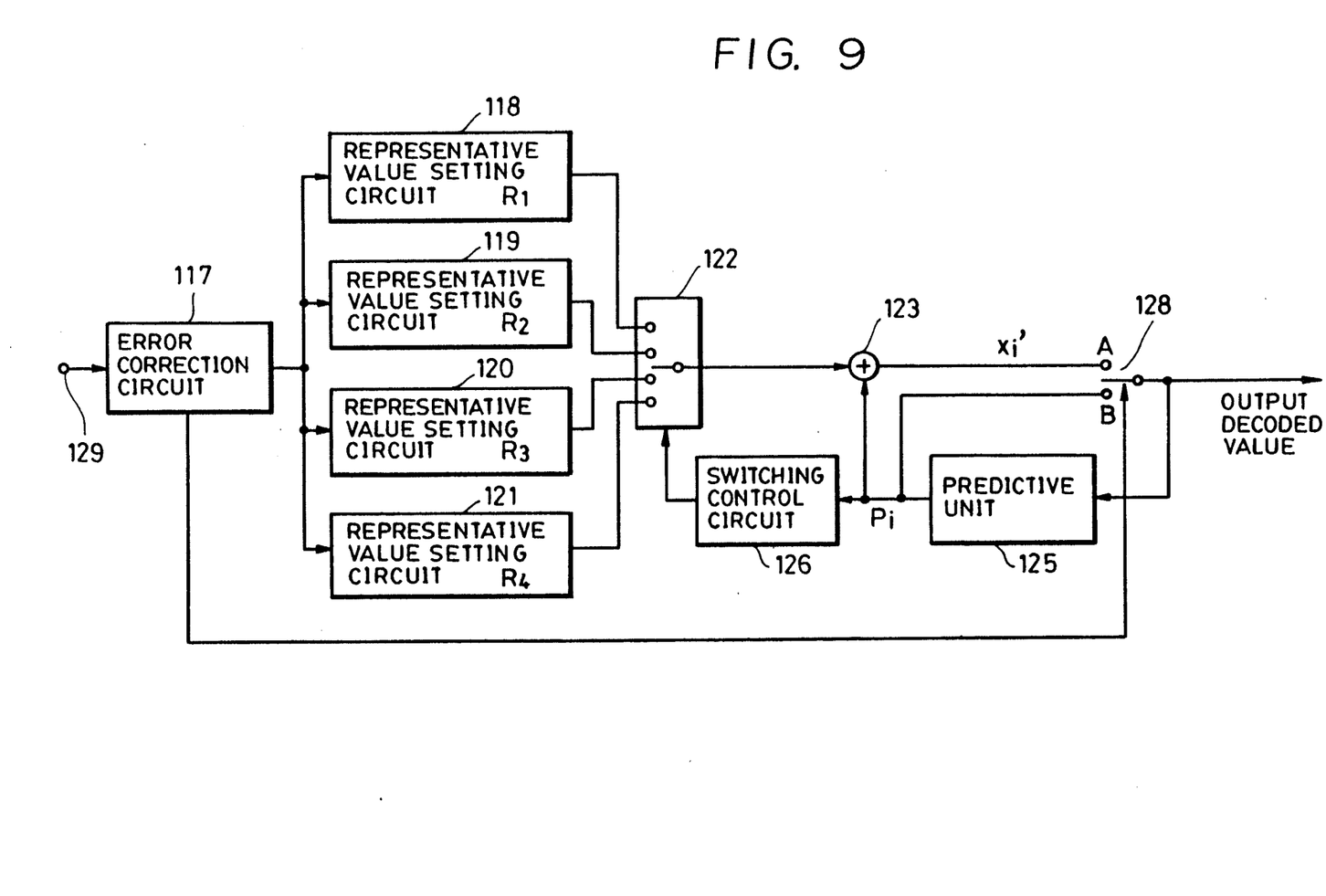
FIG. 9 is a block diagram showing the configuration of a decoding device according to still another embodiment of the present invention, corresponding to the FIG. 8 encoding device.

By decoding an encoded code encoded by an encoding device having a configuration in which a plurality of quantizers having such quantization characteristics are selectively used by a decoding device of the embodiment of the present invention shown in FIG. 9, the following specific and advantageous effects can be obtained.

FIG. 9 shows a decoding device according to still another embodiment of the present invention corresponding to the encoding device shown in FIG. 8.

In FIG. 9, an error correction circuit 117 corrects code errors in a transmitted code input from a terminal 129, and reconverts the transmitted code into the 4-bit encoded code before transmission. The resultant signal is then supplied to representative value setting circuits ($R_1$–$R_4$) 118–121.

As in the representative value setting circuits ($R_1$–$R_4$) 110–113 shown in FIG. 8, in each of representative value setting circuits ($R_1'$–$R_4'$) 118–121, the 4-bit encoded code is inversely converted into an 8-bit representative value, which is supplied to a switch 122.

The switching operation of the switch 122 is controlled by a switching control circuit 126. As in the case of FIG. 8, the switching control circuit 126 detects the two most significant bits of a decode predictive-value signal $P_i$ output from a predictive unit 125, and connects the switch 122 to the output from the representative value setting circuit corresponding to the result of the detection.

The representative value thus output from the switch 122 is added to the decode predictive value $P_i$ in an adder 123, and a decoded value $X_i'$ is thus obtained.

The switch 128 is usually connected to side A to output the decoded value output from the adder 123 as an output decoded value and also supplies the decoded value to the predictive unit 125. The predictive unit 125 is configured, for example, by the D-flip-flop 52 shown in FIG. 4, which delays a signal for a period of one sample. In this case, the immediately preceding decoded value is made the next decode predictive value.

When the error correction circuit 117 has detected an uncorrectable code error, it issues an error flag, and the switch 128 is thereby connected to side B. A decode predictive value is thereby output from the switch 128. When the predictive unit 125 comprises a D-flip-flop which delays a signal for a period of one sample, the immediately preceding decoded value is output. Since there is very strong correlation between the decode predictive value and the decoded value, an error occurring in this process is very small. Hence, the same functions and effects as in the FIG. 4 embodiment can be obtained.

Furthermore, the present embodiment has the function and effect that, even if a large predictive error exists when the above-described processing of replacing the decode predictive value with the decoded value, and a large error is thereby produced in the decoded value, the error converges. An explanation will now be provided of this function and effect.

Figure 10:
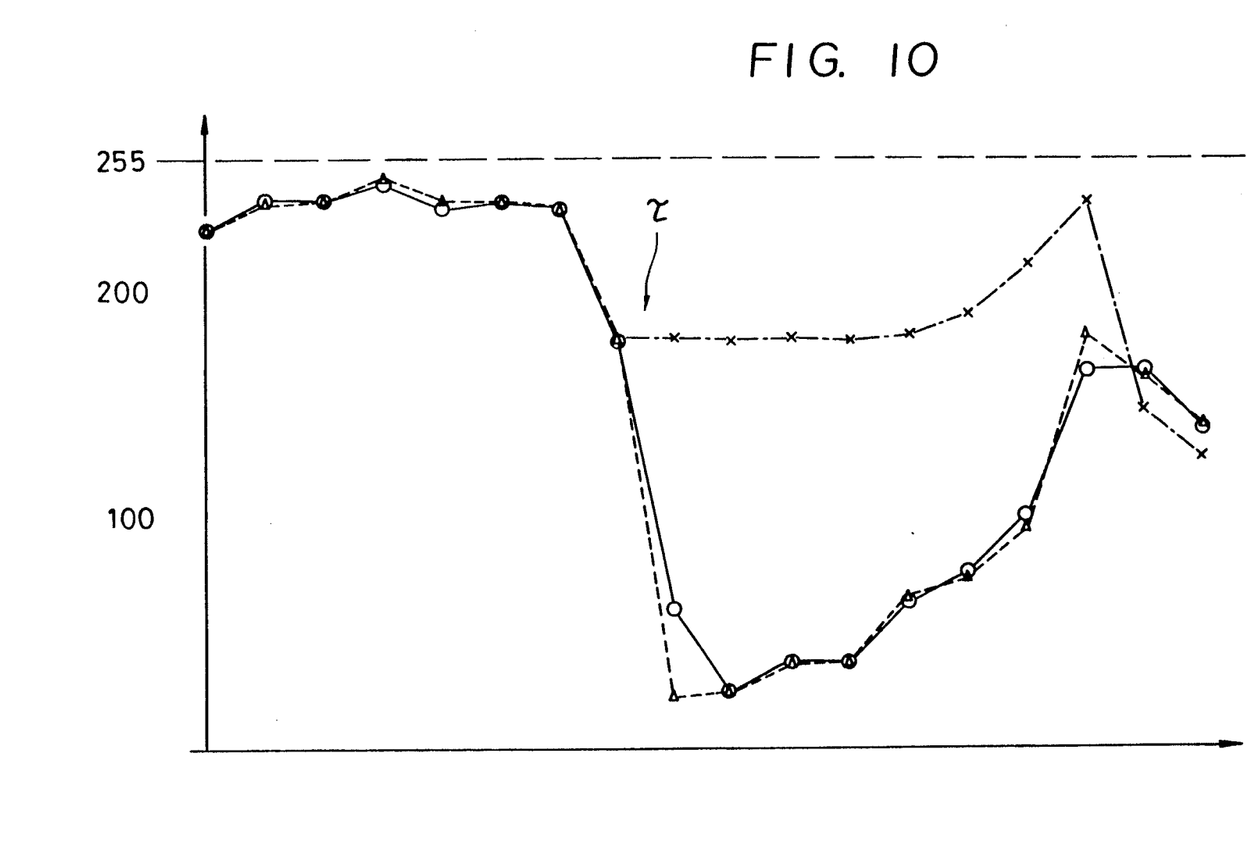
FIG. 10 is a timing chart for explaining the operation of each unit shown in FIG. 9.

FIG. 10 shows a timing chart showing the operation of the decoding device shown in FIG. 9. In FIG. 10, sampled values are indicated by O, and decoded values are indicated by Δ. Table 3 shows specific data of the sampled values, the corresponding predictive values, difference values, tables (representative value setting circuits) used, encoded codes, representative values and decoded values. In Table 3, time lapses in the rightward direction.

TABLE 3

| Sampled value | Predictive value | Difference value | Table used | Code | Representative value | Decoded value |
|---|---|---|---|---|---|---|
| 225 | | | | | | 225 |
| 237 | 225 | 12 | $R_4$ | 5 | 11 | 236 |
| 237 | 236 | 1 | $R_4$ | 3 | 1 | 237 |
| 244 | 237 | 7 | $R_4$ | 5 | 11 | 248 |
| 233 | 248 | −15 | $R_4$ | −1 | −11 | 237 |
| 236 | 237 | −1 | $R_4$ | 1 | −1 | 236 |
| 232 | 236 | −4 | $R_4$ | 0 | −4 | 232 |
| 175 | 232 | −57 | $R_4$ | −3 | −55 | 177 |
| 60 | 177 | −117 | $R_3$ | −7 | −153 | 24 |
| 25 | 24 | 1 | $R_1$ | −1 | 1 | 25 |
| 37 | 25 | 12 | $R_1$ | 1 | 11 | 36 |
| 37 | 36 | 1 | $R_1$ | −1 | 1 | 37 |
| 62 | 37 | 25 | $R_1$ | 2 | 27 | 64 |
| 75 | 64 | 11 | $R_2$ | 3 | 9 | 73 |
| 100 | 73 | 27 | $R_2$ | 4 | 21 | 94 |
| 162 | 94 | 68 | $R_2$ | 6 | 87 | 181 |
| 162 | 181 | −19 | $R_3$ | −4 | −21 | 160 |
| 137 | 160 | −23 | $R_3$ | −4 | −21 | 139 |

In FIG. 10, an original signal is indicated by a solid line, and a decoded signal is indicated by a broken line. A signal close to the original signal is restored as long as a normal decoding operation is continued.

On the other hand, for the worst case in which a code error occurs with a timing producing the largest difference value between the predictive value and the sampled value, that is, a timing $\tau$ shown in FIG. 10, decoded values output from the switch 128 shown in FIG. 9 are indicated by X in FIG. 10. Table 4 shows sampled values, predictive values, difference values, tables used, encoded codes, representative values and decoded values in this case. When the code error occurs, since the difference value itself is output, the difference value is dealt with as 0, and the decoded value does not change, as shown in Table 4. A worst case is now assumed in which the difference value is −117, so an error of more than 100 relative to the sampled value is produced in the decoded value. Calculation of the succeeding decode predictive value is performed using this decoded value, and decoding is thus continued. Although transmitted encoded codes are the same as in Table 3, the tables used are different. By continuing this decoding operation, a signal shown by a one-dot chain line in FIG. 10 is restored. As is apparent from FIG. 10, the above-described error gradually converges, and a restored signal which is almost identical to the original signal can be obtained after the lapse of a predetermined period.

As described above, the present embodiment has the superior effect that, by decoding encoded codes DPCM-encoded by the encoding device shown in FIG. 8 by the decoding device shown in FIG. 9, there is little error produced in the decoded value even if a code error occurs, and even if a large error occurs, the error gradually converges with the lapse of time.

TABLE 4

| Sampled value | Predictive value | Difference value | Table used | Code | Representative value | Decoded value |
|---|---|---|---|---|---|---|
| 225 | | | | | | 225 |
| 237 | 225 | 12 | $Q_4$ | 5 | 11 | 236 |
| 237 | 236 | 1 | $Q_4$ | 3 | 1 | 237 |

TABLE 4-continued

| Sampled value | Predictive value | Difference value | Table used | Code | Representative value | Decoded value |
|---|---|---|---|---|---|---|
| 244 | 237 | 7 | Q$_4$ | 5 | 11 | 248 |
| 233 | 248 | −15 | Q$_4$ | −1 | −11 | 237 |
| 236 | 237 | −1 | Q$_4$ | 1 | −1 | 236 |
| 232 | 236 | −4 | Q$_4$ | 0 | −4 | 232 |
| 175 | 232 | −57 | Q$_4$ | −3 | −55 | 177 |
| 60 | 177 | X → (0) | (Q$_3$) | (0) | (0) | 177 |
| 25 | 177 | | Q$_3$ | −1 | −1 | 176 |
| 37 | 176 | | Q$_3$ | 1 | 1 | 177 |
| 37 | 177 | | Q$_3$ | −1 | −1 | 176 |
| 62 | 176 | | Q$_3$ | 2 | 3 | 179 |
| 75 | 179 | | Q$_3$ | 3 | 9 | 188 |
| 100 | 188 | | Q$_3$ | 4 | 21 | 209 |
| 162 | 209 | | Q$_4$ | 6 | 27 | 236 |
| 162 | 236 | | Q$_4$ | −4 | −90 | 146 |
| 137 | 146 | | Q$_3$ | −4 | −21 | 125 |

Figure 11:
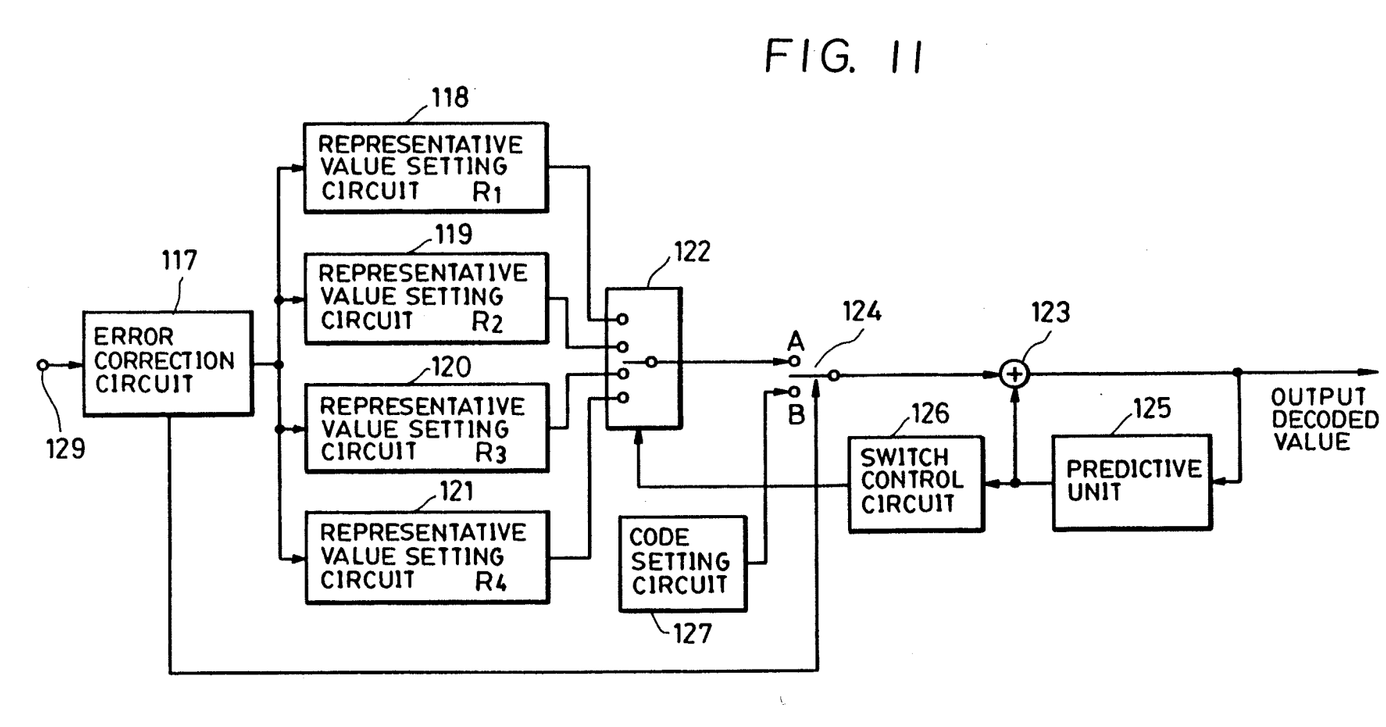
FIG. 11 is a block diagram showing the configuration of a decoding device according to still another embodiment of the present invention.

FIG. 11 is a diagram showing the configuration of a decoding device according to another embodiment in which a part of the FIG. 9 embodiment is modified. In FIG. 11, the same components as in FIG. 9 are indicated by the same numerals, and an explanation thereof will be omitted.

In the FIG. 11 embodiment, when a code error occurs, the value 0 from a code setting circuit 127 is output from a switch 124 in accordance with the error flag from the error correction circuit 117. Accordingly, the adder 123 outputs the decode predictive value output from the predictive unit 125 without modification when the code error occurs. Hence, the same functions and effects as in the decoding device shown in FIG. 9 can also be obtained in the decoding device shown in FIG. 11.

The embodiments shown in FIGS. 8–11 have the configuration in which four quantizers and inverse quantizers as shown in Tables 2.1–2.4 are selected in accordance with the level of the predictive value. In general, however, if a configuration is adopted in which n (n is an integer equal to 2 or more) quantization characteristics having a common arrangement of encoded codes relative to the amounts of difference values are set, and for at least one identical encoded code, the representative quantized value according to the n quantization characteristics becomes smaller for the quantizer used for a larger predictive value, the amount of error tends to converge with time by utilizing this code. The convergence efficiency of the error amount can be improved by setting the system so that more quantization characteristics can be selected in accordance with the predictive value, and by satisfying for more encoded codes the relationship that the representative quantized value becomes smaller as the predictive value is larger.

What is claimed is:

1. A predictive decoding device for decoding an encoded code obtained by quantizing a differential value between a sampled value and an encode predictive value, said decoding device comprising:
   (a) error detection means for detecting a code error in said encoded code and for outputting an error flag;
   (b) decoding means for receiving said encoded code and a decode predictive value, for computing a decoded value based on a differential value representative of said encoded code and on said decode predictive value, and for outputting said decoded value;
   (c) selecting means for selectively outputting one of a present decoded value computed by said decoding means and a past decoded value formerly computed by said decoding means in response to said error flag; and
   (d) predictive means which uses an output value of said selecting means to produce said decode predictive value to be input to said decoding means.

2. A device according to claim 1, wherein said selecting means replaces a present decoded value, computed by said decoding means and corresponding to an encoded code in which a code error has been detected by said error detection means, with a past decoded value immediately preceding the present decoded value to be replaced.

3. A device according to claim 2, wherein said selecting means replaces the present decoded value computed by said decoding means with the past decoded value in response to said error flag.

4. A device according to claim 1, wherein said selecting means outputs said past decoded value for a predetermined period of samples.

5. A device according to claim 1, wherein said predictive means produces said decode predictive value by delaying said output value output from said selecting means for a period of one sample.

6. A device according to claim 1, wherein said decoding means includes look-up table means, having said encoded code and said decode predictive value as inputs, for outputting the decoded value, and wherein said predictive means delays the output value of said selecting means for a period of one sample to produce said decode predictive value.

7. A device according to claim 6, wherein said error flag is an input to said look-up table means, and wherein values having the same values as decode predictive values are written, irrespective of said encoded code, in each address corresponding to occurrence of an error flag which indicates the detection of a code error.

8. A device according to claim 1, wherein said encoded code is obtained by quantizing with quantization characteristics controlled in accordance with said encode predictive value, and wherein said decoding means controls inverse quantization characteristics in accordance with said decode predictive value and calculates said decoded value using said controlled inverse quantization characteristics.

9. A predictive decoding device for decoding an encoded code obtained by quantizing a differential value between a sampled value and an encode predictive value, comprising:
   (a) error detection means for detecting a code error in said encoded code and for outputting an error flag;
   (b) decoding means for receiving said encoded code and a decode predictive value, for computing a decoded value based on a differential value representative of said encoded code and on said decode predictive value, and for outputting said decoded value; and
   (c) predictive means which uses an output value of said decoding means to produce said decode predictive value to be input to said decoding means, wherein said decoding means includes replacement means for replacing said encoded code with a code indicating that said differential value is zero in response to said error flag.

10. A device according to claim 9, wherein said decoding means includes inverse quantization means for inversely quantizing said encoded code to produce said differential value, and addition means for adding said differential value and said decode predictive value, and wherein said replacement means replaces said differential value with zero in response to said error flag.

11. A device according to claim 9, wherein said replacement means outputs zero for a predetermined sampling period.

12. A device according to claim 9, wherein said encoded code is an encoded code obtained by quantizing with quantization characteristics controlled in accordance with said encode predictive value, and wherein said decoding means controls inverse quantization characteristics in accordance with said decode predictive value and calculates said decoded value using said controlled inverse quantization characteristics.

13. A predictive decoding device for decoding an encoded code, said predictive decoding device comprising:

(a) error detection means for detecting a code error in said encoded code and for outputting an error flag;

(b) decoding means for receiving said encoded code and a decode predictive value, for computing a decoded value based on said encoded code and on said decode predictive value, and for outputting said decoded value;

(c) selecting means for selectively outputting one of a present decoded value computed by said decoding means and a past decoded value formerly computed by said decoding means in response to said error flag; and (d) predictive means for producing said decode predictive value to be input to said decoding means by using an output value of said selecting means.

14. A device according to claim 13, wherein said selecting means includes switching means for selectively outputting said decoded value and said decode predictive value in response to said error flag.

15. A device according to claim 13, wherein said decoding means inputs said error flag to indicate an address of a look up table means, and wherein values having the same values as decode predictive values are written, irrespective of said encoded code, in each address corresponding to an error flag which indicates the detection of a code error.

16. A device according to claim 13, wherein said encoded code is an encoded code obtained by quantizing with quantization characteristics controlled in accordance with an encode predictive value, and wherein said decoding means controls inverse quantization characteristics in accordance with said decode predictive value and calculates said decoded value using said controlled inverse quantization characteristics.

* * * * *

UNITED STATES PATENT AND TRADEMARK OFFICE
CERTIFICATE OF CORRECTION

PATENT NO. : 5,325,374
DATED : June 28, 1994
INVENTOR(S) : Nobuhiro Hoshi, et al.

It is certified that error appears in the above-indentified patent and that said Letters Patent is hereby corrected as shown below:

COLUMN 1

Line 28, "Yi." should read --code Yi.--.

COLUMN 5

Line 25, "respectively an" should read --respectively. An--.

COLUMN 6

Line 26, "FIG. 6" should read --FIG. 7--.

COLUMN 8

Line 7, "subtractor" should read --subtracter--.

UNITED STATES PATENT AND TRADEMARK OFFICE
CERTIFICATE OF CORRECTION

PATENT NO. : 5,325,374
DATED : June 28, 1994
INVENTOR(S) : NOBUHIRO HOSHI, ET AL.

It is certified that error appears in the above-identified patent and that said Letters Patent is hereby corrected as shown below:

<u>COLUMN 14</u>

Line 23, "value," should read --value, and--.
   Line 24, "and" should be deleted.

Signed and Sealed this

Thirty-first Day of January, 1995

Attest:

BRUCE LEHMAN

*Attesting Officer*     *Commissioner of Patents and Trademarks*